United States Patent
Hsieh et al.

(10) Patent No.: US 11,257,858 B2
(45) Date of Patent: Feb. 22, 2022

(54) METHOD OF FABRICATING A SENSOR DEVICE

(71) Applicant: HIMAX TECHNOLOGIES LIMITED, Tainan (TW)

(72) Inventors: Yu-Jui Hsieh, Tainan (TW); Po-Nan Chen, Tainan (TW); Ya-Jing Yang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 171 days.

(21) Appl. No.: 16/860,084

(22) Filed: Apr. 28, 2020

(65) Prior Publication Data

US 2021/0335881 A1  Oct. 28, 2021

(51) Int. Cl.
*H01L 27/146* (2006.01)

(52) U.S. Cl.
CPC .. *H01L 27/14685* (2013.01); *H01L 27/14621* (2013.01); *H01L 27/14625* (2013.01); *H01L 27/14627* (2013.01); *H01L 27/14636* (2013.01)

(58) Field of Classification Search
CPC ......... H01L 27/14685; H01L 27/14621; H01L 27/14625; H01L 27/14627; H01L 27/14636
See application file for complete search history.

(56) References Cited

U.S. PATENT DOCUMENTS

| | | | |
|---|---|---|---|
| 2018/0061879 A1* | 3/2018 | Kurihara | H04N 9/045 |
| 2018/0097029 A1* | 4/2018 | Kurihara | H01L 27/14618 |
| 2019/0341409 A1* | 11/2019 | Yamabi | H04N 5/2253 |

\* cited by examiner

*Primary Examiner* — Jonathan Han
(74) *Attorney, Agent, or Firm* — JCIPRNET

(57) ABSTRACT

A method of fabricating a sensor device including at least the following steps is provided. An optical film stack is formed on a sensor substrate, wherein the sensor substrate includes a sensor region and a pad region beside the sensor region, and the optical film stack covers the sensor region while exposes the pad region. A releasing pattern is formed on the pad region. A lens material layer is formed on the sensor substrate to cover the releasing pattern and the optical film stack. The releasing pattern is removed from the sensor substrate to expose the pad region by patterning the lens material layer to form a lens on the optical film stack.

17 Claims, 7 Drawing Sheets

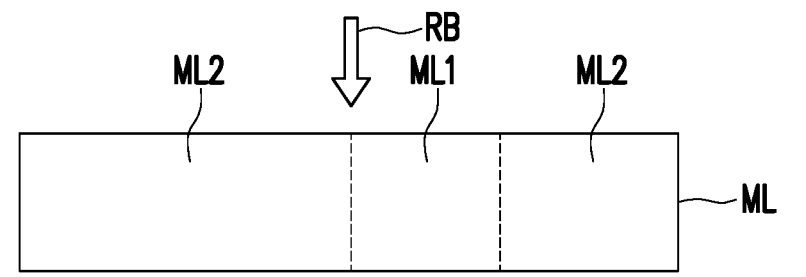
FIG. 5
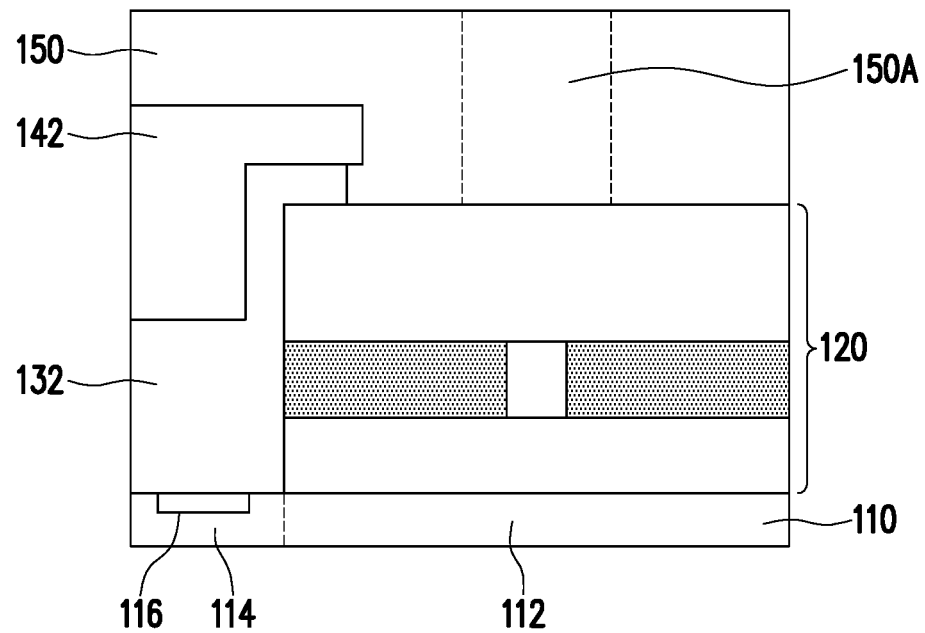
FIG. 6
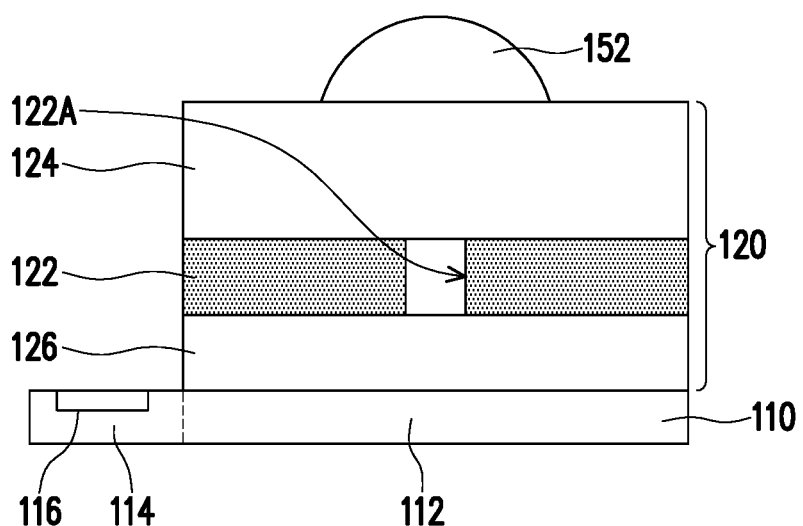

ns a sensor
METHOD OF FABRICATING A SENSOR DEVICE

BACKGROUND

Technical Field

The disclosure is related to a method of fabricating an electronic device, and particularly to a method of fabricating a sensor device.

Description of Related Art

Various electronic devices are researched and designed for different demands and there are usually various issues to be solved by the industries. For example, in a sensor device such as an image sensor device, an optical film is usually required to be disposed on the sensor region for properly collecting the to-be sensed light, but the pad of the sensor device needs to be exposed for bonding an external device. Accordingly, the removing of the optical film above the pad is usually required for fabricating a sensor device and the industry may seek a method to simplify the removing of the optical film above the pad for improving the fabrication efficiency.

SUMMARY

The disclosure is directed to an efficient method of fabricating a sensor device.

A method of fabricating a sensor device in accordance with some embodiments includes at least the following steps. An optical film stack is formed on a sensor substrate, wherein the sensor substrate includes a sensor region and a pad region beside the sensor region, and the optical film stack covers the sensor region while exposes the pad region. A releasing pattern is formed on the pad region. A lens material layer is formed on the sensor substrate to cover the releasing pattern and the optical film stack. The releasing pattern is removed from the sensor substrate to expose the pad region by patterning the lens material layer to form a lens on the optical film stack.

In accordance with some embodiments, the releasing pattern is formed by sequentially forming a releasing material layer and a photoresist material layer on the sensor substrate; and patterning the photoresist material layer using a lithography process to form the releasing pattern and a photoresist pattern on the releasing pattern, wherein the photolithography process includes a partial exposure step and a developing step.

In accordance with some embodiments, a portion of the releasing material layer covering the optical film stack is removed under the developing step to form the releasing pattern.

In accordance with some embodiments, the releasing material layer is inactive to a radiation utilized in the partial exposure step.

In accordance with some embodiments, the releasing material layer is baked prior to the forming the photoresist material layer.

In accordance with some embodiments, the lens material layer is formed covering the photoresist pattern.

In accordance with some embodiments, the photoresist pattern is removed before forming the lens material layer.

In accordance with some embodiments, the lens material layer is patterned by performing a photolithography process on the lens material layer, the photolithography process includes a partial exposure step and a developing step, and a portion of the lens material layer is removed under the developing step to form the lens.

In accordance with some embodiments, the releasing pattern is removed under the developing step.

In accordance with some embodiments, the releasing pattern is inactive to a radiation utilized in the partial exposure step.

In accordance with some embodiments, a photoresist pattern is further formed on the releasing pattern before forming the lens material layer, wherein the photoresist pattern covered by the lens material layer is lifted-off by removing the releasing pattern under the developing step.

In accordance with some embodiments, the optical film stack includes a collimator layer disposed on the sensor substrate in the sensor region.

In accordance with some embodiments, the optical film stack further includes a first transparent layer disposed on the collimator layer.

In accordance with some embodiments, the optical film stack further includes a second transparent layer disposed between the collimator layer and first transparent layer, and the first transparent layer is thicker than the second transparent layer.

In accordance with some embodiments, the optical film stack further includes a transparent layer disposed between the collimator layer and the sensor substrate.

In accordance with some embodiments, the optical film stack further includes an infrared filter layer between the collimator layer and the sensor substrate.

In accordance with some embodiments, the sensor substrate includes a pad formed in the pad region and the pad is exposed by removing the releasing pattern.

In light of the foregoing, the method of fabricating the sensor device in accordance with some embodiments may expose the pad in the pad region by using a simplified and efficient method.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIGS. 1 to 6 schematically illustrate a method of fabricating a sensor device.

DESCRIPTION OF THE EMBODIMENTS

Figure 1:
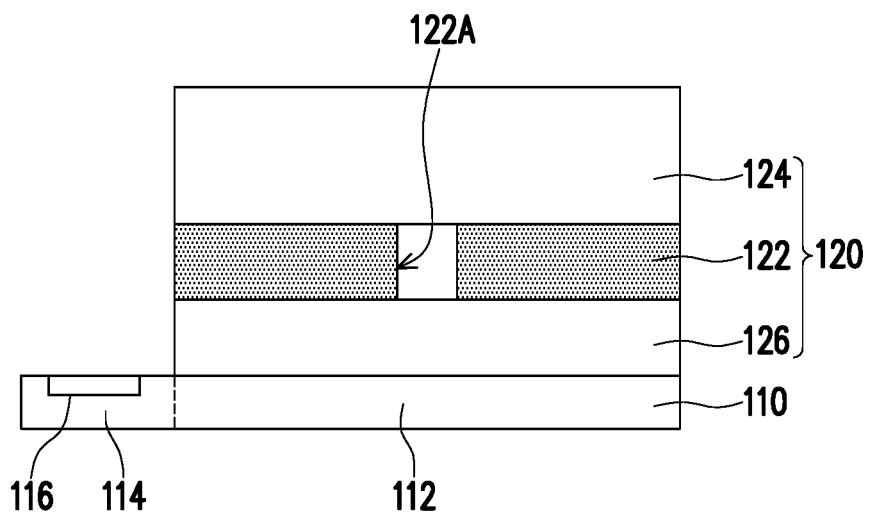

FIGS. 1 to 6 schematically illustrate a method of fabricating a sensor device. In FIG. 1, a sensor substrate 110 is provided. The sensor substrate 110 may include a sensor region 112 and a pad region 114 beside the sensor region 112. The sensor substrate 110 may be a semiconductor substrate having sensor elements (not shown) such as a complementary metal oxide semiconductor (CMOS) and charge coupled device (CCD) sensor element and a pad 116 formed therein. The sensor element may be formed in the sensor region 112 and the pad 116 may be formed in the pad region 114. The pad 116 formed in the pad region 114 may be electrically connected to the sensor element and used for transmitting the electric signal of the sensor element to an external device. In addition, an optical film stack 120 is formed on the sensor substrate 110 in the sensor region 112 and the optical film stack 120 covers the sensor region 112 while exposes the pad region 114. Specifically, the optical film stack 120 may at least expose a portion or a whole of the pad 116 in the pad region 114.

The optical film stack 120 may include multiple optical films stacking on one another. In FIG. 1, the optical film stack 120 may include a collimator layer 122, a first transparent layer 124 and a second transparent layer 126. In some embodiments, the second transparent layer 126 may be omitted so that the collimator layer 122 may be in physical contact with the sensor substrate 110. In some alternative embodiments, the optical film stack 120 may include further film layers. For example, an infrared filter layer may be disposed on the sensor substrate 110 between the sensor substrate 110 and the collimator layer 122. Alternatively, one or more further transparent layer and/or color filter layer may be disposed between the first transparent layer 124 and the collimator layer 122.

The collimator layer 122 may be a black photoresist layer and have an aperture 122A penetrating through the whole thickness of the collimator layer 122. The aperture 122A allows the incident light to pass through the collimator layer 122 and irradiate on the sensor element formed in the sensor substrate 110. In some embodiments, the sensor surface of the sensor element may overlap the aperture 122A for receiving the light passing through the aperture 122A.

The first transparent layer 124 is formed on the collimator layer 122 and allows the light to pass it through. The collimator layer 122 is disposed between the first transparent layer 124 and the sensor substrate 110, and the first transparent layer 124 may fill the aperture 122A of the collimator layer 122. The first transparent layer 124 may be made of an organic transparent material. In some embodiments, the thickness of the first transparent layer 124 may determine the focus of the sensor element, but the disclosure is not limited thereto. In some embodiments, the first transparent layer 124 may not provide color filter effect or light absorption effect so that the light irradiating the sensor region 112 may pass through the first transparent layer 124 without a notable weakening, but the disclosure is not limited thereto. In some alternative embodiments, the first transparent layer 124 may provide specific color filter effect based on the sensing function of the sensor element disposed in the sensor substrate 110.

The second transparent layer 126 is disposed between the collimator layer 122 and the sensor substrate 110. The second transparent layer 126 may be made of a material the same as the first transparent layer 124. In some embodiments, the second transparent layer 126 may have a desirable affinity to the sensor substrate 110 and the collimator layer 122 so as to serve as an adhesive layer to ensure the firmness of the optical film stack 120. In other words, the peeling of the collimator layer 122 from the sensor substrate 110 may be prevented due to the adhesive effect of the second transparent layer 126. In some embodiments, the thickness of the first transparent layer 124 may be greater than the thickness of the second transparent layer 126, but the disclosure is not limited thereto.

Figure 2:
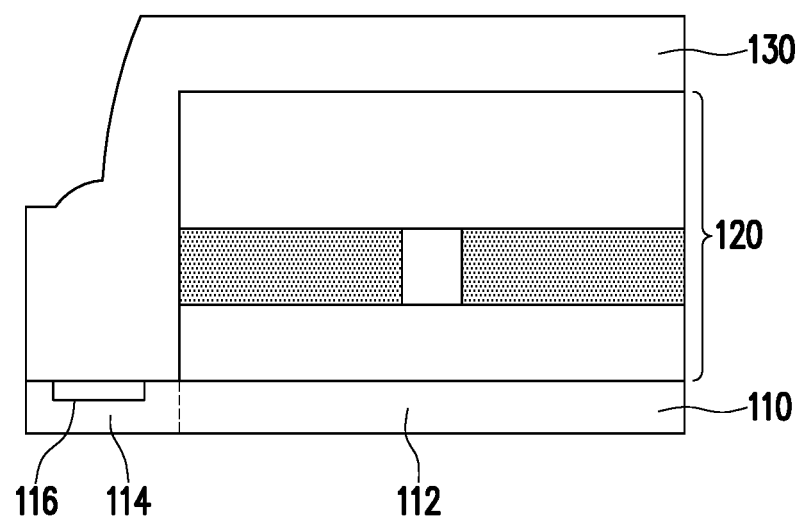

In FIG. 2, a releasing material layer 130 may be formed on the sensor substrate 110. The releasing material layer 130 may be formed by a coating process and may cover the entire top surface of the sensor substrate 110. For example, the releasing material layer 130 may extend continuously from the sensor region 112 to the pad region 114 and cover the optical film stack 120 in the sensor region 112 and the pad 116 in the pad region 114. In some embodiments, a baking step may be performed after coating the releasing material layer 130 on the sensor substrate 110. The baking process may be performed by placing the sensor substrate 110 with the optical film stack 120 and the releasing material layer 130 thereon in an oven and baking the whole structure at a baking temperature for a baking time. In some embodiments, the baking temperature may be 220° C. and the baking time may be 20 minutes, but the disclosure is not limited thereto.

Figure 3:
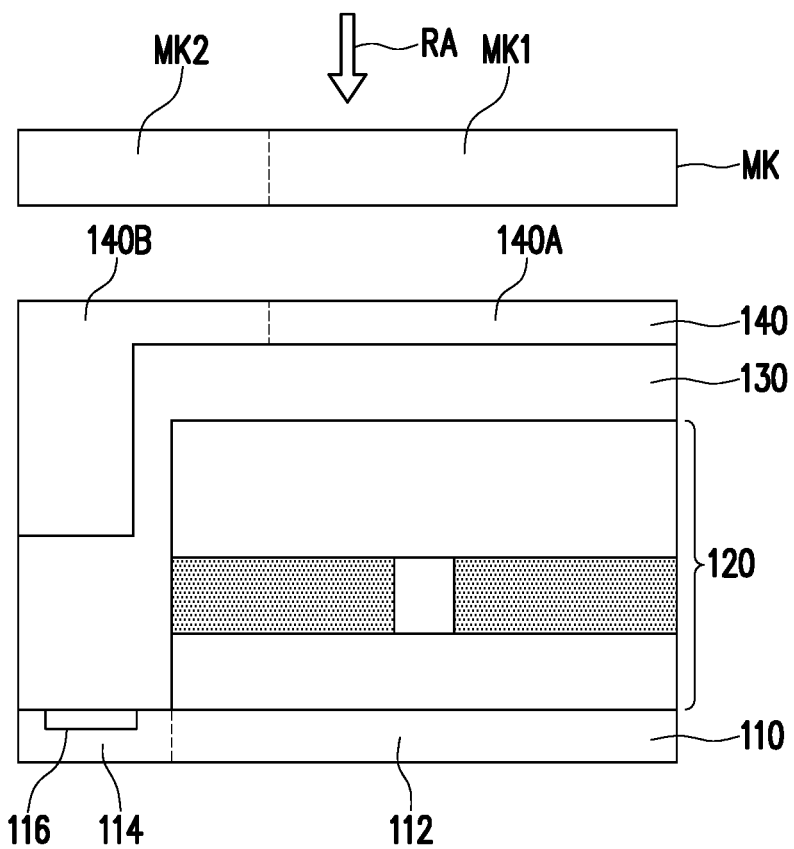

In FIG. 3, a photoresist material layer 140 is formed on the sensor substrate 110 following the baking of the releasing material layer 130. The photoresist material layer 140 may be formed on the sensor substrate 110 by a coating process. The releasing material layer 130 and the photoresist material layer are sequentially formed on the sensor substrate 110 so that the photoresist material layer 140 covers the releasing material layer 130. Subsequently, the photoresist material layer 140 may be patterned using a photolithography process which includes a partial exposure step followed by a developing step and the releasing material layer 130 may also be patterned through the photolithography process.

In the partial exposure step of the photolithography process, a radiation RA may irradiate the sensor substrate 110 through a photomask MK. The photomask MK may include a first region MK1 and a second region MK2 having different transparency from the first region MK1. For example, the radiation RA may pass through the photomask MK at one of the first region MK1 and the second region MK2 while being shielded and/or prohibited at the other. The first region MK1 of the photomask MK may overlap the sensor region 112 in the irradiation direction of the radiation RA and the second region MK2 of the photomask MK may overlap the pad region 114 and a portion of the sensor region 112 in the irradiation direction of the radiation RA.

In the partial exposure step, either the portion 140A of the photoresist material layer 140 under the first region MK1 or the portion 140B of the photoresist material layer 140 under the second region MK2 subject to the irradiation of the radiation RA. In the embodiment, the radiation RA utilized in the partial exposure step may induce a photoreaction of the photoresist material layer 140 while the releasing material layer 130 is inactive to the radiation RA. Accordingly, after performing the partial exposure step, the portion 140A of the photoresist material layer 140 or the portion 140B of the photoresist material layer 140 is photo-reacted while the entire of the releasing material layer 130 is not.

In some embodiments, the transparency of the first region MK1 and that of the second region MK2 may collaborate with the photosensitivity of the photoresist material layer 140. For example, in the case that the photoresist material layer 140 is made of positive type photoresist material, the material of the photoresist material layer 140 may be decomposed due to the photoreaction under the irradiation of the radiation RA, such that the photomask MK may be designed that the first region MK1 of the photomask MK allows the radiation RA to pass through the photomask MK and the second region MK2 of the photomask MK prohibits and/or shields the radiation RA. Namely, a portion 140A of the photoresist material layer 140 under the first region MK1 may subject to the irradiation of the radiation RA and may be decomposed while another portion 140B of the photoresist material layer 140 under the second region MK2 remains the initial property.

On the contrary, in the case that the photoresist material layer 140 is made of negative type photoresist material, the irradiation of the radiation RA may induce a cross-linking reaction of the material of the photoresist material layer 140, such that the photomask MK may be designed that the first region MK1 of the photomask MK prohibits and/or shields the radiation RA and the second region MK2 of the photomask MK allows the radiation RA to pass through the photomask MK. Namely, the portion 140B of the photoresist material layer 140 under the second region MK2 may subject to the irradiation of the radiation RA and may react a cross-linking reaction while another portion 140A of the photoresist material layer 140 under the first region MK2 remains the initial property.

Figure 4:
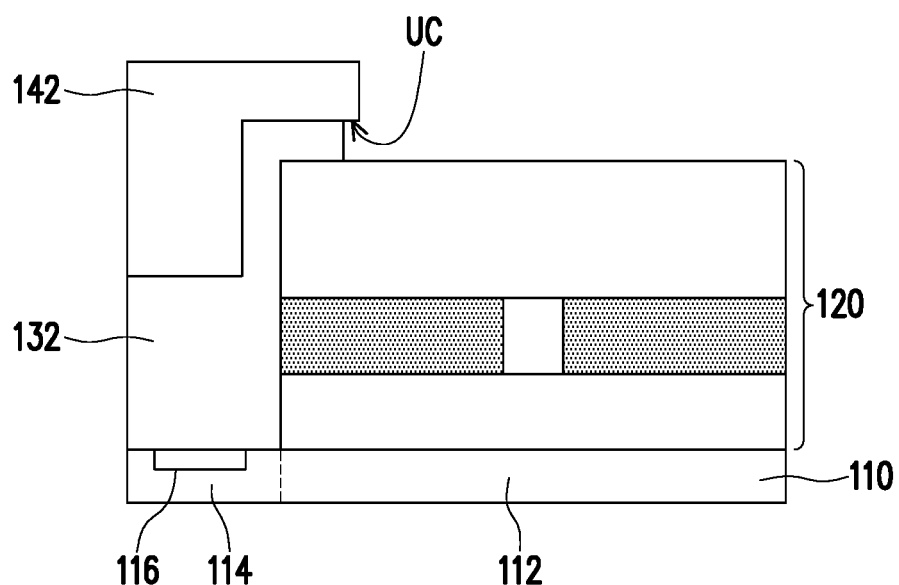

After the partial exposure step, the developing step may be performed to remove a removable portion of the photoresist material layer 140 using a development agent to form the photoresist pattern 142 shown in FIG. 4. Specifically, after the partial exposure step, the portion 140A of the photoresist material layer 140 above the optical film stack 120 is removable by the development agent, and thus the portion 140A of the photoresist material layer 140 is removed under the developing step. During the developing step, the portion 140A is removed by the development agent and the releasing material layer 130 underlying the portion 140A may be exposed to the development agent. In the present embodiment, the material of the releasing layer 130 though is not photo-reacted is also soluble for the development agent. Therefore, a portion of the releasing material layer 130 underlying the portion 140A is also removed by the development agent utilized for patterning the photoresist material layer 140 to form the releasing pattern 132 shown in FIG. 4.

In the embodiment, the releasing material layer 130 is inactive under the irradiation of the radiation RA utilized in the partial exposure step while the photoresist material layer 140 is reactive under the irradiation of the radiation RA in the partial exposure step. Specifically, after the partial exposure step, the portion 140A of the photoresist material layer 140 is soluble to the development agent and the portion 140B of the photoresist material layer 140 is insoluble or hardly soluble to the development agent. In addition, the whole of the releasing material layer 130 is soluble to the development agent. Accordingly, a portion of the releasing material layer 130 underlying the photoresist pattern 142 may be removed by the development agent and thus the releasing pattern 132 may be shrunk inwardly with respect to the photoresist pattern 142 to form an undercut UC.

The releasing pattern 132 and the photoresist pattern 142 may fill the low-lying structure at the pad region 114 so that the semi-fabricated structure shown in FIG. 4 have a smaller thickness difference between the sensor region 112 and the pad region 114 than the semi-fabricated structure shown in FIG. 1. In some embodiments, the level difference of the top surface in the semi-fabricated structure shown in FIG. 4 between the sensor region 112 and the pad region 114 is smaller than the level difference of the top surface in the semi-fabricated structure shown in FIG. 1 between the sensor region 112 and the pad region 114. Accordingly, the releasing pattern 132 and the photoresist pattern 142 may provide a planarization effect for the subsequent steps.

As shown in FIG. 5, a lens material layer 150 may be formed on the sensor substrate 110. The lens material layer 150 covers the photoresist pattern 142 and the optical film stack 120, and extends continuously from the sensor region 112 to the pad region 114. The lens material layer 150 is formed on a planarized surface so that the thickness of the lens material layer 150 may be properly controlled to improve the fabrication yield. In the embodiment, the lens material layer 150 may be made of a photo-sensitive material such as a photoresist material and the lens material layer 150 may be patterned by a photolithography process including a partial exposure step followed by a developing step.

In the partial exposure step of the photolithography process for patterning the lens material layer 150, a radiation RB may irradiate the sensor substrate 110 through a photomask ML. The photomask ML may include a first region ML1 and a second region ML2 having different transparency from the first region ML1. The photomask ML and the material of the lens material layer 150 may be designed that the portion 150A of the lens material layer 150 under the first region ML1 is remained on the sensor substrate 110 after the photolithography process.

In some embodiments, the lens material layer 150 may be made of a negative type photoresist material. The photomask ML allows the radiation RB to pass through at the first region ML1 while the radiation RB is shielded and/or prohibited at the second region ML2. Namely, only the portion 150A of the lens material layer 150 subjects to the irradiation of the radiation RB and reacts a photoreaction. For example, the portion 150A of the lens material layer 150 may be cross-linked to become more solid and dense than the initial state while the rest portion of the lens material layer 150 not.

After the partial exposure step, the portion of the lens material layer 150 not irradiated by the radiation RB may be removed by performing the developing step using a development agent. In some embodiments, a reflowing step may be further performed following the developing step to shape the portion 150A of the lens material layer 150 remaining on the optical film stack 120 to a lens-like shape so that the portion 150A of the lens material layer 150 remaining on the optical film stack 120 is shaped to form the lens 152 shown in FIG. 6. The reflowing step may include a heating step, such as a backing step. In the present embodiment, the releasing pattern 132 is also soluble to the development agent and thus the releasing pattern 132 is removed along with the removing of the lens material layer 150 under the developing step. The photoresist pattern 142 over the releasing layer 132 though is insoluble or hardly soluble to the development agent is lifted-off along with the removing of the releasing pattern 132. Therefore, after the developing step, the pad 116 in the pad region 114 is exposed and the lens 152 is formed on the optical film stack 120.

Figure 7:
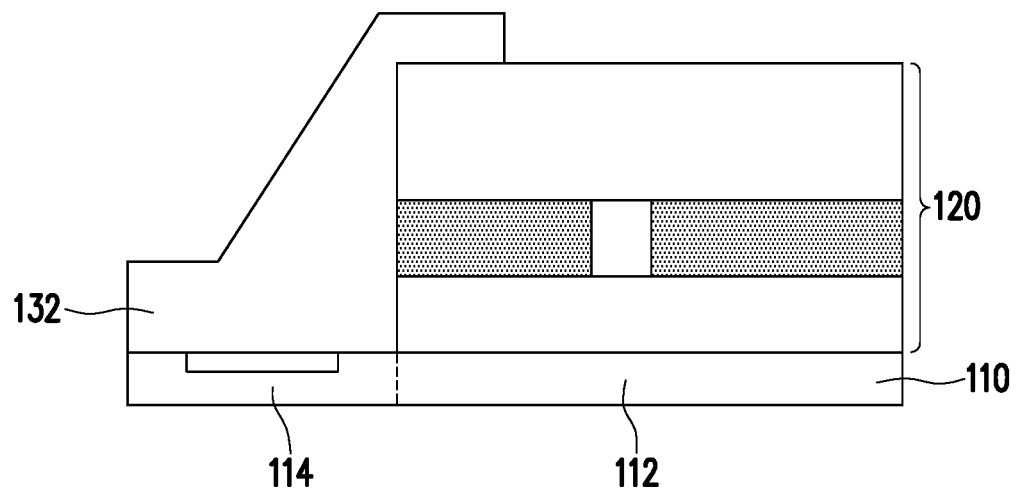
FIGS. 7 and 8 schematically illustrate alternative steps of the method of fabricating a sensor device.
Figure 8:
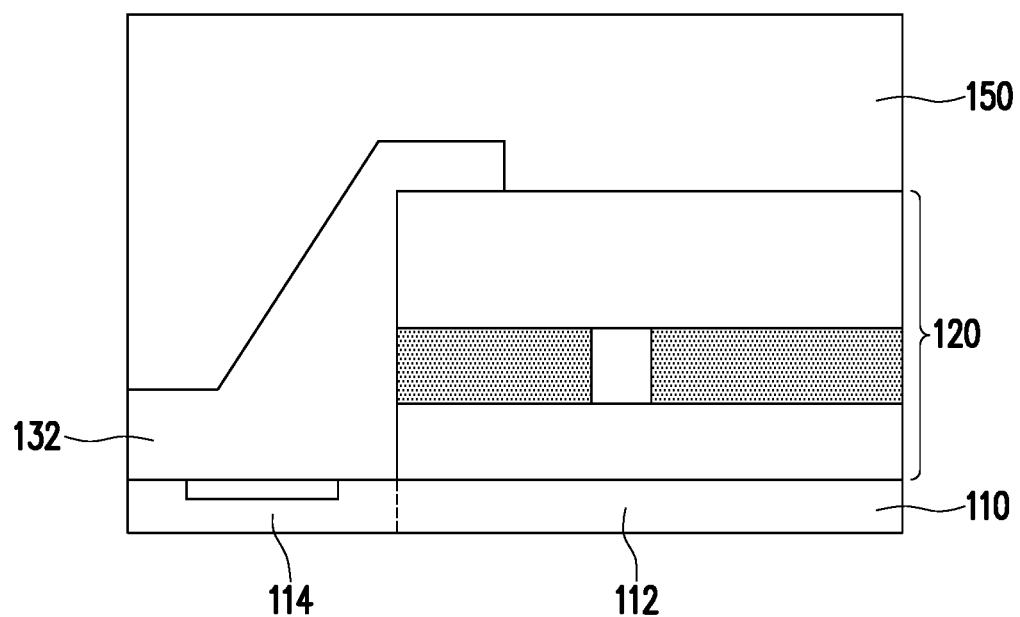

FIGS. 7 and 8 schematically illustrate alternative steps of the method of fabricating a sensor device. In an alternative embodiment, after the step of FIG. 4, the photoresist pattern 142 may be removed so that the releasing pattern 132 is exposed as shown in FIG. 7. The releasing pattern 132 fills the low-lying structure at the pad region 114 so that the level difference between the top surface of the releasing pattern 132 and the top surface of the optical film stack 120 is smaller than the level difference between the top surface of the sensor substrate 110 at the pad region 114 and the top surface of the optical film stack 120. Therefore, the releasing pattern 132 also provides a planarization effect for the subsequent steps.

In FIG. 8, the lens material layer 150 is formed on the sensor substrate 110 and covers the releasing pattern 132 and the optical film stack 120. In the embodiment, the lens material layer 150 is in physical contact with the top surface of the releasing pattern 132. Subsequently, the lithography process including the steps shown in FIGS. 5 and 6 is performed to pattern the lens material layer 150 and form the lens 152 shown in FIG. 6. In the lithography process, a portion of the lens material layer 150 is exposed to the radiation utilized in the partial exposure step and is later removed in the developing process. In addition, the releasing pattern 132 is also removed by the development agent so that the pad 116 formed in the pad region 114 is exposed after patterning the lens material layer 150 as shown in FIG. 6. Since the step of FIG. 7 shows that the photoresist pattern 142 shown in FIG. 4 is removed before forming the lens material layer 150, a contamination between the materials of the photoresist pattern 142 and the lens material layer 150 may be prevented. In some embodiments, the photoresist pattern 142 to be removed in the step of FIG. 7 may be made of a positive type photoresist material that is not subjected to the irradiation of the radiation utilized in the partial exposure step of forming the photoresist pattern 142.

After performing the steps disclosed in FIGS. 1 to 6 or the steps disclosed in FIGS. 1 to 4, 7, 8, 5 and 6, a sensor device 100 is formed. The sensor device 100 shown in FIG. 6 includes a sensor substrate 110, an optical film stack 120, and a lens 152. The sensor substrate 110 has a sensor region 112 and a pad region 114 beside the sensor region 112. The optical film stack 120 is disposed in the sensor region 112 and exposes the pad region 114. A pad 116 formed in the pad region 114 is thus exposed and configured to be connected to an external device. The optical film stack 120 may include a collimator layer 122, a first transparent layer 124 and a second transparent layer 126. The collimator layer 122 may be disposed between the first transparent layer 124 and the second transparent layer 126. The lens 152 is disposed on the optical film stack 120 and may be aligned with the aperture 122A of the collimator layer 122 in the optical film stack 120.

Figure 9:
FIG. 9 to FIG. 14 schematically illustrate the steps of forming the optical film stack of a sensor device in accordance with some embodiments.
Figure 10:
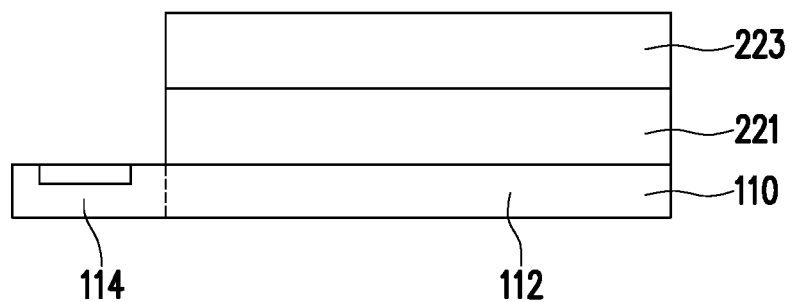
Figure 11:
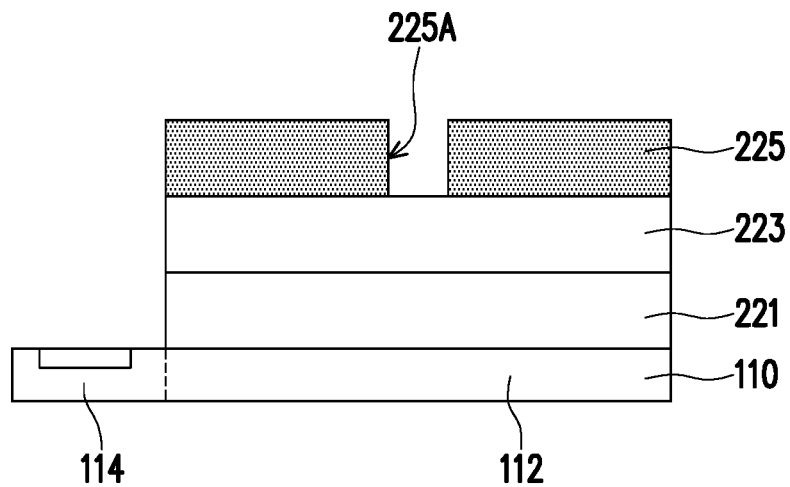
Figure 12:
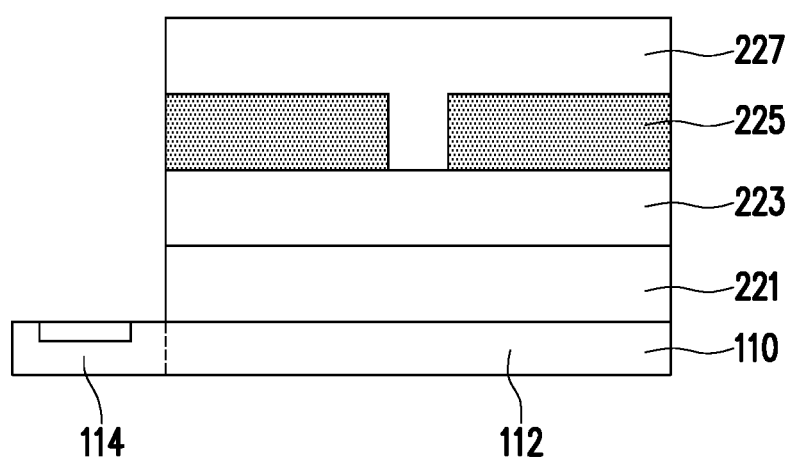
Figure 13:
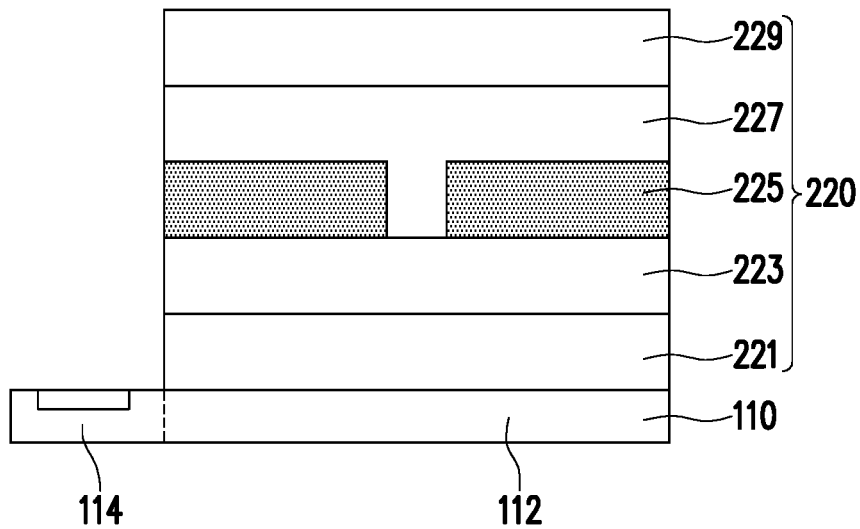
Figure 14:
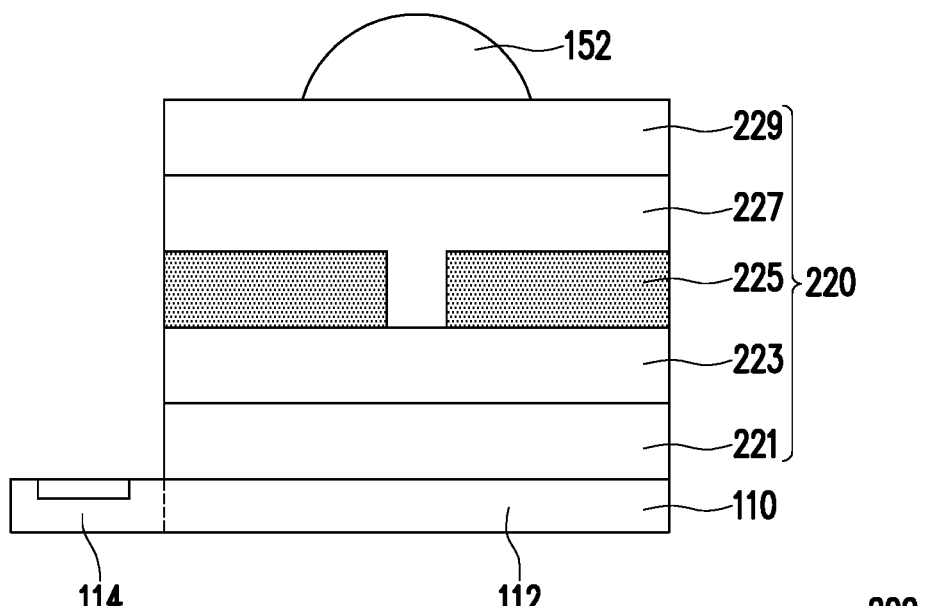

FIG. 9 to FIG. 14 schematically illustrate the steps of forming the optical film stack of a sensor device in accordance with some embodiments. In FIG. 9, an infrared filter layer 221 is formed on the sensor substrate 110. The sensor substrate 110 may include a sensor region 112 and a pad region 114 beside the sensor region 112 and the infrared filter layer 221 is patterned to be located in the sensor region 112 while exposes the pad region 114. In FIG. 10, a transparent layer 223 is formed on the infrared filter layer 223. In FIG. 11, a collimator layer 225 is formed on the transparent layer 223. The collimator layer 225 may be made of black material such as a black photoresist material and have an aperture 225A allowing light to pass through the collimator layer 225 via the aperture 225A. In some embodiments, the material of the transparent layer 223 may have desirable affinity to the collimator layer 225 so as to provide an adhesive effect. In other words, the configuration of the transparent layer 223 may prevent the peeling of the collimator layer 225 from the sensor substrate 110. In FIG. 12, another transparent layer 227 is formed on the collimator layer 225 and the transparent layer 227 may fill the aperture 225A. In FIG. 13, a further transparent layer 229 is disposed on the transparent layer 227. In the embodiment, the infrared filter layer 221, the transparent layer 223, the collimator layer 225, the transparent layer 227 and the transparent layer 229 sequentially stacked on the sensor substrate 110 form an optical film stack 220. The transparent layer 223, the transparent layer 227 and the transparent layer 229 may be made of the same material, but the disclosure is not limited hereto. In addition, the thickness of the transparent layer 229 may be different from the thickness of the transparent layer 223 and/or the thickness of the transparent layer 227. In FIG. 14, the lens 152 is subsequently formed on the optical film stack 220 to construct a sensor device 200. In the embodiment, the optical film stack 220 that may serve as an alternative implement for the optical film stack 120 shown in FIGS. 1 to 9 and the lens 150 in the sensor device 200 may be formed by using the methods described in FIGS. 1 to 9. In addition, the lens 152 may be formed on the sensor substrate 110 by the steps of FIGS. 2 to 6 or the steps of FIGS. 2 to 4, 7, 8, 5 and 6. Therefore, the details of the method of forming the lens 152 are not reiterated here.

In view of the above, the method of fabricating the sensor device in accordance with the embodiments includes forming a releasing pattern at the pad region that is not covered by the optical film stack. Accordingly, the releasing pattern may provide a planarization effect for the subsequent steps. In addition, the material of the releasing pattern in some embodiments may be inactive to the exposure step in the lithography process but soluble to the development agent utilized in the developing step in the lithography process. Accordingly, the releasing pattern may be patterned and removed in the lithography process for patterning other material layers without an extra step. In some embodiments, the removing of the releasing pattern also lifts off the material above the releasing pattern. Therefore, the method of fabricating a sensor device may be simplified and/or more efficient.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of fabricating a sensor device, comprising:
    forming an optical film stack on a sensor substrate, wherein the sensor substrate comprises a sensor region and a pad region beside the sensor region, and the optical film stack covers the sensor region while exposes the pad region;
    forming a releasing pattern on the pad region;
    forming a lens material layer on the sensor substrate to cover the releasing pattern and the optical film stack; and
    removing the releasing pattern from the sensor substrate to expose the pad region by patterning the lens material layer to form a lens on the optical film stack.

2. The method of claim 1, wherein the releasing pattern is formed by
    sequentially forming a releasing material layer and a photoresist material layer on the sensor substrate; and
    patterning the photoresist material layer using a lithography process to form the releasing pattern and a photoresist pattern on the releasing pattern, wherein the photolithography process comprises a partial exposure step and a developing step.

3. The method of claim 2, wherein a portion of the releasing material layer covering the optical film stack is removed under the developing step to form the releasing pattern.

4. The method of claim 2, wherein the releasing material layer is inactive to a radiation utilized in the partial exposure step.

5. The method of claim 2, wherein the releasing material layer is baked prior to the forming the photoresist material layer.

6. The method of claim 2, wherein the lens material layer is formed covering the photoresist pattern.

7. The method of claim 2, wherein the photoresist pattern is removed before forming the lens material layer.

8. The method of claim 1, wherein the lens material layer is patterned by performing a photolithography process on the lens material layer, the photolithography process comprises a partial exposure step and a developing step, and a portion of the lens material layer is removed under the developing step to form the lens.

9. The method of claim 8, wherein the releasing pattern is removed under the developing step.

10. The method of claim 8, wherein the releasing pattern is inactive to a radiation utilized in the partial exposure step.

11. The method of claim 8, further forming a photoresist pattern on the releasing pattern before forming the lens material layer, wherein the photoresist pattern covered by the lens material layer is lifted-off by removing the releasing pattern under the developing step.

12. The method of claim 1, wherein the optical film stack comprises a collimator layer disposed on the sensor substrate in the sensor region.

13. The method of claim 12, wherein the optical film stack further comprises a first transparent layer disposed on the collimator layer.

14. The method of claim 13, wherein the optical film stack further comprises a second transparent layer disposed between the collimator layer and first transparent layer, and the first transparent layer is thicker than the second transparent layer.

15. The method of claim 12, wherein the optical film stack further comprises a transparent layer disposed between the collimator layer and the sensor substrate.

16. The method of claim 12, wherein the optical film stack further comprises an infrared filter layer between the collimator layer and the sensor substrate.

17. The method of claim 1, wherein the sensor substrate comprises a pad formed in the pad region and the pad is exposed by removing the releasing pattern.

* * * * *